(12) United States Patent
Dimmler et al.

(10) Patent No.: US 7,718,466 B2
(45) Date of Patent: May 18, 2010

(54) PERFORMANCE IMPROVEMENTS OF OFETS THROUGH USE OF FIELD OXIDE TO CONTROL INK FLOW

(75) Inventors: Klaus Dimmler, Colorado Springs, CO (US); Viorel Olariu, Colorado Springs, CO (US); Thomas S. Moss, III, Colorado Springs, CO (US)

(73) Assignee: OrganicID, Inc., Colorado Springs, CO (US)

( * ) Notice: Subject to any disclaimer, the term of this patent is extended or adjusted under 35 U.S.C. 154(b) by 0 days.

(21) Appl. No.: 12/171,982

(22) Filed: Jul. 11, 2008

(65) Prior Publication Data

US 2010/0009497 A1    Jan. 14, 2010

(51) Int. Cl.
*H01L 51/40* (2006.01)
(52) U.S. Cl. ................. 438/99; 257/40; 257/66
(58) Field of Classification Search ........... 438/99, 438/106, 151; 257/40, 66, E51.007
See application file for complete search history.

(56) References Cited

U.S. PATENT DOCUMENTS

| | | | |
|---|---|---|---|
| 6,603,141 B2 * | 8/2003 | Lach et al. | 257/40 |
| 7,619,242 B2 * | 11/2009 | Wu et al. | 257/40 |
| 2006/0081849 A1 | 4/2006 | Lee et al. | |
| 2007/0023749 A1 | 2/2007 | Hwang et al. | |
| 2007/0134857 A1 | 6/2007 | Suh et al. | |
| 2008/0311698 A1 * | 12/2008 | Mohapatra et al. | 438/99 |

* cited by examiner

Primary Examiner—Phuc T Dang

(57) ABSTRACT

An OFET includes a thick dielectric layer with openings in the active region of a transistor. After the field dielectric layer is formed, semiconductor ink is dropped in the active region cavities in the field dielectric layer, forming the semiconductor layer. The ink is bounded by the field dielectric layer walls. After the semiconductor layer is annealed, dielectric ink is dropped into the same cavities. As with the semiconductor ink, the field dielectric wall confines the flow of the dielectric ink. The confined flow causes the dielectric ink to pool into the cavity, forming a uniform layer within the cavity, and thereby decreasing the probability of pinhole shorting. After the dielectric is annealed, a gate layer covers the active region thereby completing a high performance OFET structure.

12 Claims, 24 Drawing Sheets

PERFORMANCE IMPROVEMENTS OF OFETS THROUGH USE OF FIELD OXIDE TO CONTROL INK FLOW

FIELD OF THE INVENTION

The present invention is related to Organic Field Effect Transistors ("OFETs") and related integrable devices, and more specifically, to the use of a patterned field dielectric layer such as a silicon dioxide layer to control and contain and organic solution-based layer.

BACKGROUND OF THE INVENTION

A standard top-gate OFET is formed by depositing a layer of semiconductor followed by a layer of dielectric on conductive source/drain electrodes. A conductive layer is then deposited on top of the dielectric between the source and drain electrodes to form an OFET structure. Two important determinants of OFET performance are: (1) the semiconductor layer must be deposited between the source and drain electrodes, but must minimize the overlap over the source and drain electrodes, and (2) the dielectric should be as thin as possible without resulting in short circuits.

One problem with the standard fabrication method described above, particularly with respect to the top-gate OFET structure, is that the semiconductor ink tends to flow far beyond the edge of the source and drain electrodes, causing the semiconductor layer to extend beyond desirable boundaries, thereby introducing undesired capacitance between the gate and the drain. This increased capacitance is responsible for significant loss of transistor switching speed, thereby causing circuits built with this structure to run more slowly. Another problem with the above OFET structure is that, when making the dielectric layer thin to increase transistor performance, there is an increased probability of shorting between the gate and the source/drain through pinholes in the dielectric, created in large measure by non-uniform ink flow of the dielectric.

What is desired, therefore, is a novel OFET structure in which at least the boundaries of the ink in the dielectric layer are tightly controlled to substantially improve switching speeds and to reduce pinhole shorting associated with the prior art structures.

BRIEF DESCRIPTION OF THE DRAWINGS

The foregoing and other objects, features and advantages of the invention will become more readily apparent from the following detailed description of preferred embodiments of the invention, which proceeds with reference to the accompanying drawings, wherein.

DETAILED DESCRIPTION

Figure 1:
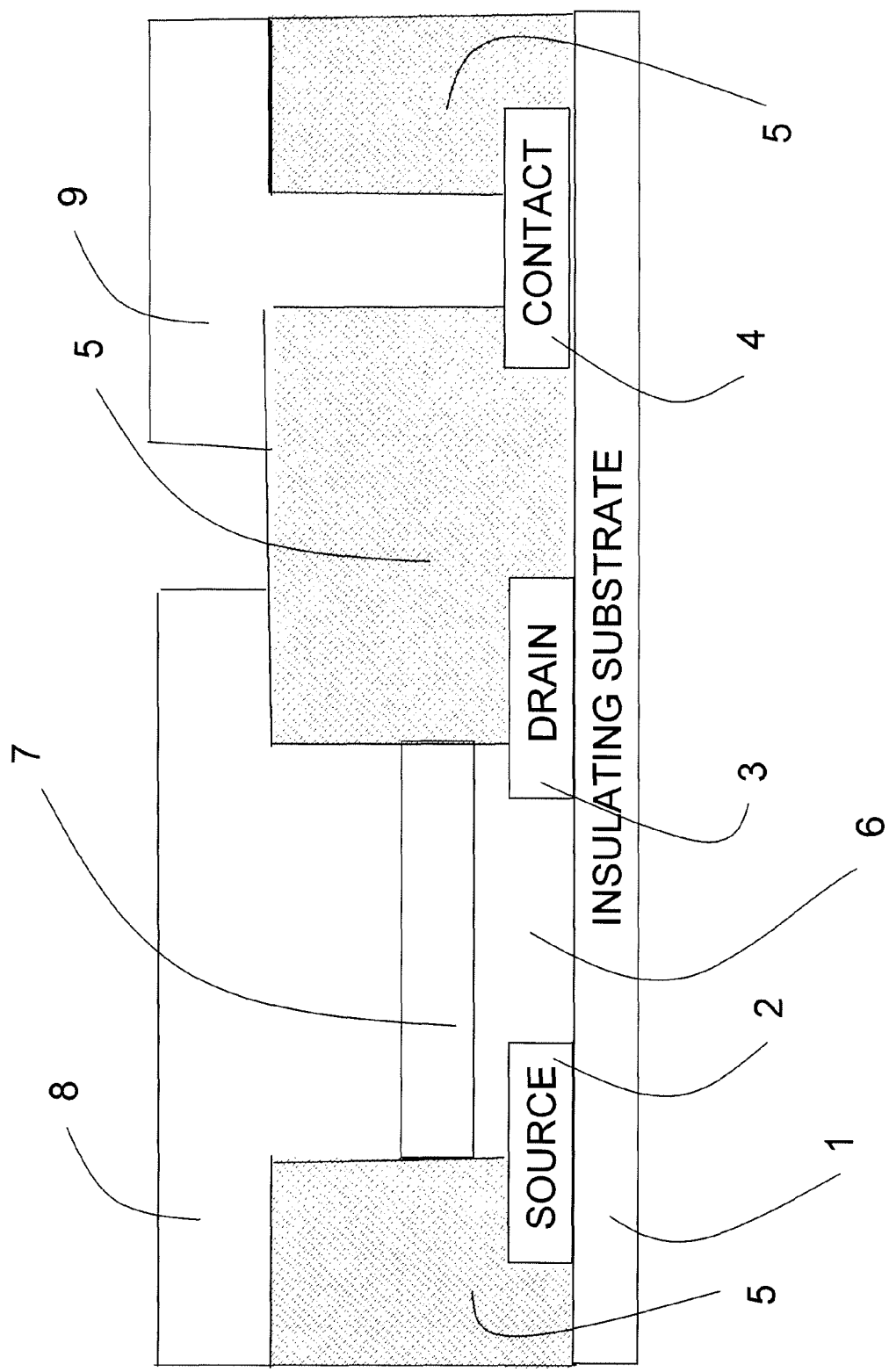
FIG. 1 is a cross-sectional diagram of a top-gate OFET wherein the field dielectric layer is formed before the semiconductor layer is formed according to the present invention.

According to the present invention, a solution to both of the problems associated with the prior art is addressed by adding a field dielectric layer before the semiconductor layer is deposited. In particular, the field dielectric comprises a thick dielectric layer with openings in the active region of a transistor, the active region being defined as the region wherein the semiconductor layer is desired. After the field dielectric layer is formed, semiconductor ink is dropped in the active region cavities in the field dielectric layer, forming the semiconductor layer. The ink is now bounded by the field dielectric layer walls, thus confining the flow of the semiconductor. Through the method of the present invention, it is ensured that the semiconductor material remains within desired boundaries to optimize the performance of the device. After the semiconductor layer is appropriately annealed, the dielectric ink is dropped into the same cavities. As with the semiconductor ink, the field dielectric wall confines the flow of the dielectric ink. The confined flow causes the dielectric ink to pool into the cavity, forming a uniform layer within the cavity, and thereby decreasing the probability of pinhole shorting. After the dielectric is appropriately annealed, a gate layer covers the active region thereby completing a high performance OFET structure with defined semiconductor boundaries, thus minimizing undesirable parasitic capacitance.

It should be noted that since the field dielectric layer is not used in the active portion of the transistor, many parameters ordinarily critical in the dielectric layer can be significantly relaxed. For example, the field dielectric layer can be thick and does not require significant thickness control. Requirements related to dielectric quality and breakdown voltages can also be significantly relaxed. Due to this flexibility, there is a wide latitude in how this layer can be produced while maintaining yield in the process:

(1) The relaxed specification of the field dielectric layer makes it possible to use photoresists for this layer. After the formation of the source/drain layer, a layer of photoresist is coated over the entire circuit surface. The photoresist is then appropriately exposed, developed, and baked to form openings in the active region;

(2) The relaxed specification of the field dielectric makes it possible to use a number of additive methods far simpler to achieve including, for example, screen printing, gravure, and flexography.

Other advantages of the use of a patterned field dielectric layer according to the present invention in an OFET process flow include:

(1) Reduced interconnect metal capacitance. In the active area of the transistor, a thin dielectric is desired. However, it is undesirable to have thin dielectric thickness in areas not involved in the transistor structure where the dielectric layer serves to isolate conductive interconnect on the first conductive layer (source/drain contacts) and the second conductive layer (gate contact). Thin dielectric in those areas increases the capacitance of the interconnect signals, thereby slowing down the circuit. The thicker field dielectric in those regions decreases the capacitance of the interconnect traces, while independently allowing the dielectric in the transistor region (i.e., the active region) to be made thinner;

(2) Reduced sensitivity to source/drain and gate overlap. The overlap between the gate metal and the source/drain electrodes slows down the switching speed of the device due to increased capacitance. This problem can be addressed by carefully aligning those two layers, which can be challenging in an organic electronic process. If the field dielectric defines that active region, however, the capacitance between the gate and source/drain is reduced even if there is an overlap. Consequently, the performance of the device increases even with a loose alignment tolerance between the gate and source/drain layers;

(3) Reduced sensitivity to source/drain and semiconductor overlap. According to the present invention, the overlap between the semiconductor layer and the source/drain contacts is reduced by controlling semiconductor ink flow within the limits of the field dielectric walls. It should be noted, however, that even if an overlap does occur, the effects of that overlap are dramatically reduced due to the thicker oxide in the non-transistor areas; and (4) Reduced shorting between gate and source/drain layers. In addition to being used in the transistor areas, a typical circuit uses the conductive gate layer and the conductive source/drain layer as a means of interconnecting devices. Using the field dielectric process described hereinbelow, the gate layer and the source/drain layers are separated by the thicker field oxide layer in regions not involved with the transistor. Because the field dielectric layer is thicker, the probability of pinholes through the dielectric layer is reduced, thereby correspondingly lowering the probability of shorting.

In addition to the first top-gate OFET structure and method according to the present invention, a second top-gate OFET structure, a bottom-gate OFET structure, a ferroelectric capacitor structure suitable for integration with an OFET, and vertical and horizontal resistors suitable for integration with an OFET are described and claimed. All of the structures take advantage of the confining structure of the patterned field dielectric layer according to the present invention.

Referring now to FIG. 1, the final structure of a first implementation (field oxide before semiconductor) of an OFET fabricated according to the present is shown. The various layers and elements of the OFET device shown in FIG. 1 are as follows: insulating substrate 1 is preferably flexible and can be fabricated from materials such as PET, PEN, Kapton; source 2, drain 3 and contact 4 can be fabricated from conductive materials such as known metal interconnect materials, nano-particle conductors, or a conductive polymer; thick dielectric layer 5 is typically a field oxide layer, but other insulating materials can be used; organic semiconductor layer 6 is described in greater detail below; a thin dielectric layer 7 is the gate oxide layer; another conductive layer is used to fabricate the gate conductor 8 of the transistor and an interconnect 9 contacts contact 4. The conductive layer can be known interconnect metals, nano-particle conductor, or a conductive polymer. The structure shown in FIG. 1 is further described below with respect to sequential cross-sectional diagrams 2-6.

Figure 2:
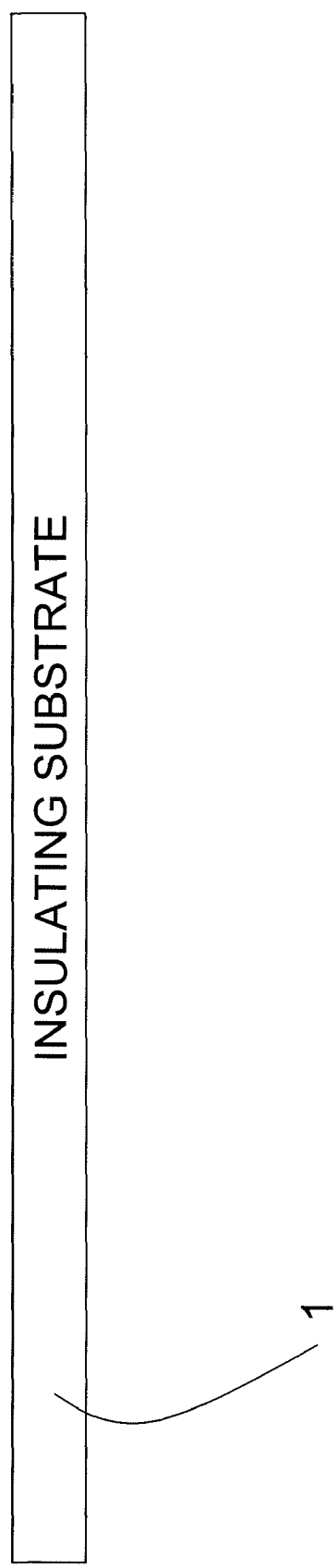
FIGS. 2-6 are sequential cross-sectional diagrams showing the process steps for fabricating the top-gate OFET shown in FIG. 4.
Figure 3:
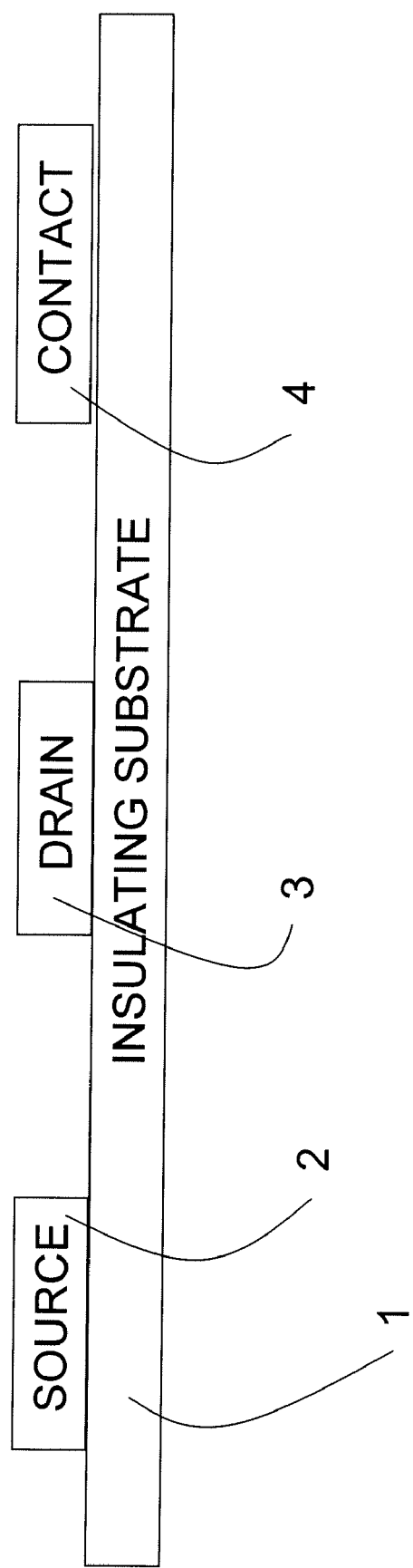

Referring now to FIG. 2, a first step of a first OFET implementation is shown, providing the insulating starting material 1. The insulating substrate could be any insulating substrate, but is preferably a flexible material such as PET, PEN, or Kapton Referring now to FIG. 3, a second step of the first OFET implementation is shown, depositing a first conductive layer to form the source, drain, and contact. The first conductive layer establishes source 2 and drain 3 of an individual OFET transistor. In addition, the same conductive layer is also used as a means to make connections between sources and drains of other transistors. There are occasions where a connection is desired to a second conductive layer (the gate conductor of the OFET transistors), a layer to be deposited later. A location where such connection is made with a future layer is referred to as a "contact" and is shown as contact 4 in FIG. 3.

Figure 4:
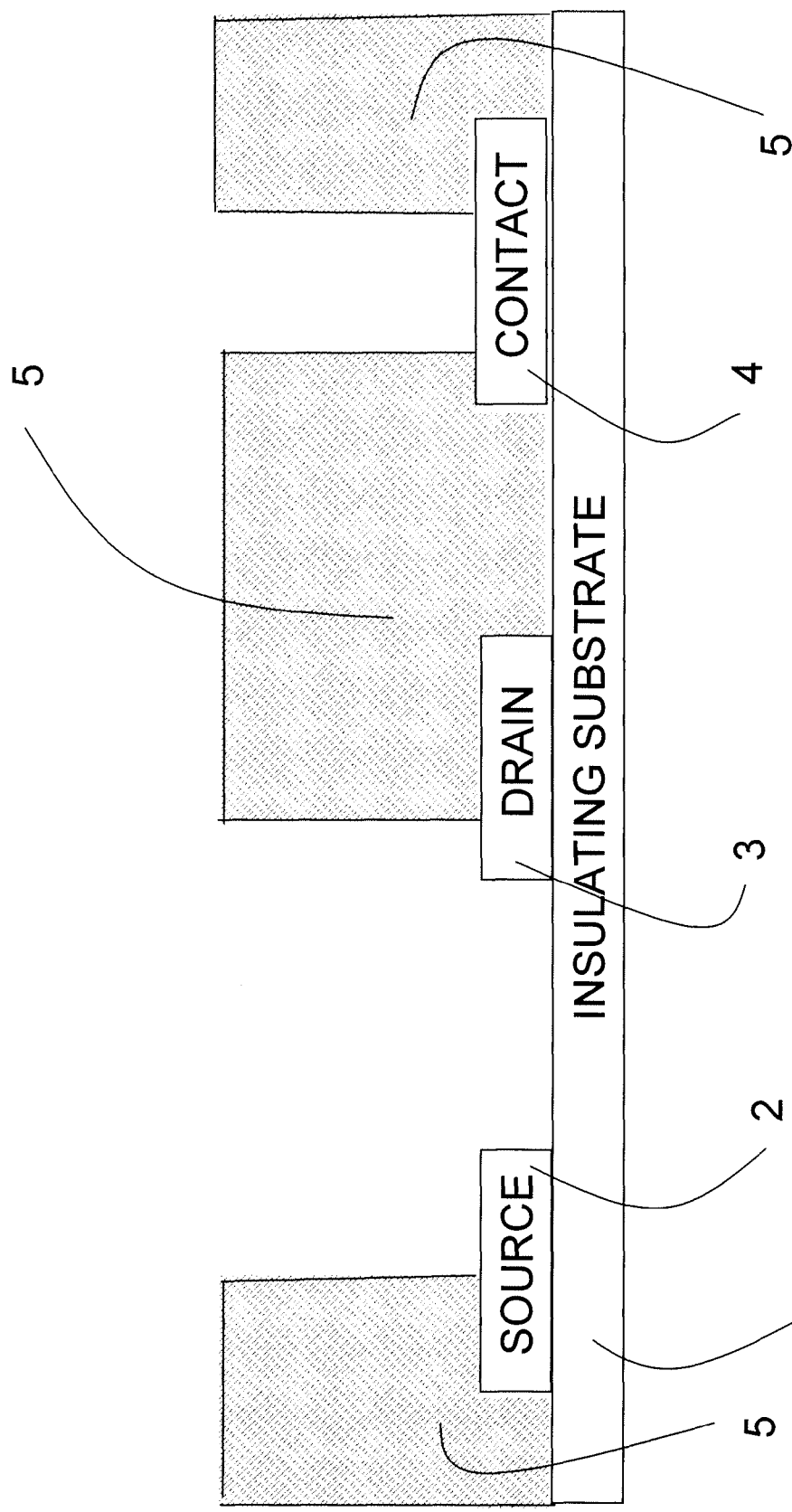

Referring now to FIG. 4, a third step of the first OFET implementation is shown, depositing the thick field dielectric layer, typically an oxide layer. Field oxide layer 5 is deposited such that it an opening exists in the channel region of the transistor (the region between the source and drain) and that an opening exists above the contact. The purpose of the thick field dielectric layer 5 is to decrease capacitance between the first conductive layer and the second conductive layer (to be deposited later) as much as possible. Accordingly, the dielectric layer 5 is a thick dielectric layer (on the order of one micron thick) and preferably a low dielectric constant material. Surface roughness is not necessarily required, permitting a wide range of deposition methods. Such methods include screen printing, gravure printing, flexography printing, or inkjet printing. Alternatively, the field dielectric layer could be spun and then patterned with standard photolithography methods. The field dielectric material is preferably an organic material, but could also be inorganic in the form of a precursor solution or suspended nanoparticles. The photoresist itself could also be used as the field dielectric.

Figure 5:
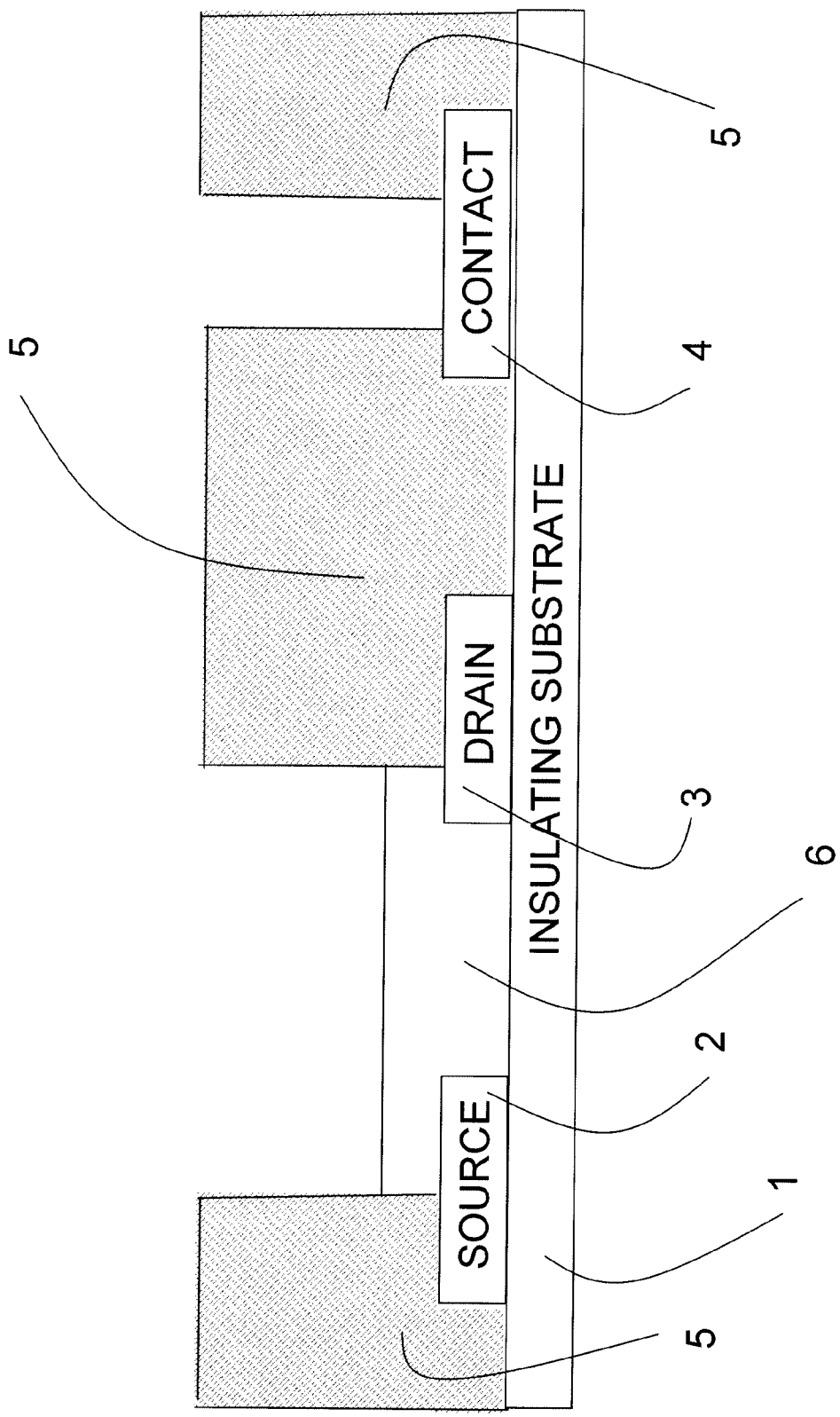

Referring now to FIG. 5, a fourth step of the first OFET implementation is shown, depositing the semiconductor layer. A solution-based semiconductor layer 6 is dropped in the active area transistor cavity defined by the field oxide layer 5. This step is preferably accomplished by inkjet printing, but other methods such as pico-dropping are also possible. The semiconductor material can be an organic semiconductor such polythiophene or solution-based pentacene, or a solution-based inorganic semiconductor in the form of a precursor solution or suspended nanoparticles. It is important to note that since the semiconductor solution is confined by the walls of the field oxide layer 5, relatively high resolution patterning of low viscosity semiconductor, which would otherwise flow to much larger dimensions, is enabled. By the same mechanism, it is also possible to obtain a thicker semiconductor layer 6 than is possible with a single pass of a low viscosity solution. Prior to deposition of the semiconductor layer 6, it is possible to treat the deposition surfaces to create improved order in the final semiconductor layer 6. Such surface treatments include thiols, OTS and HMDS. Subsequent to deposition, the semiconductor is appropriately annealed to optimize order in the semiconductor layer.

Figure 6:
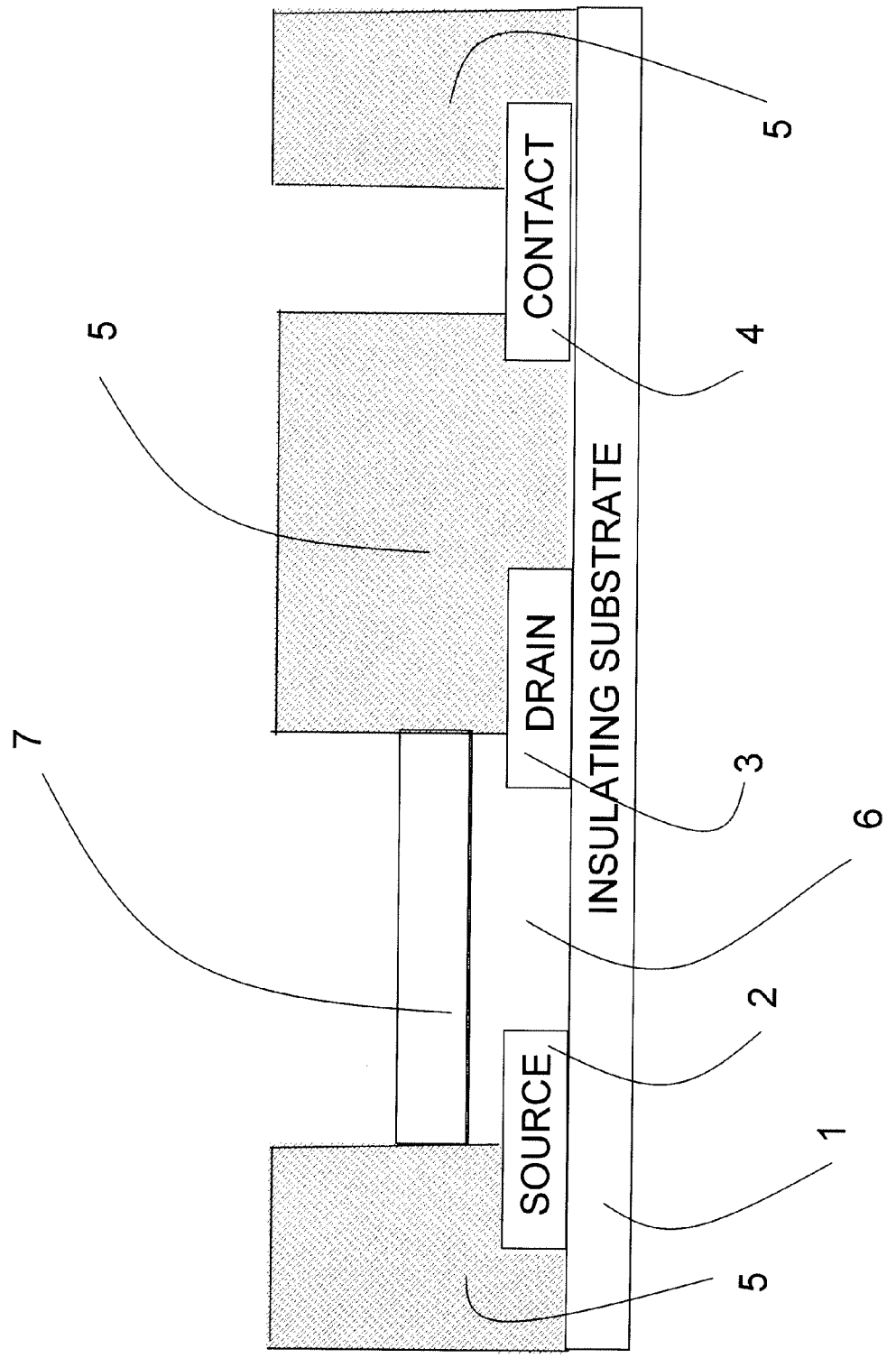

Referring now to FIG. 6, a fifth step of the first OFET implementation is shown, depositing the gate dielectric layer. A solution-based dielectric layer 7 is dropped in the active area transistor cavity defined by the field oxide layer 5. This step is preferably accomplished by inkjet printing, but other methods such as pico-dropping or spinning are also possible. The gate dielectric material can be an organic dielectric or an solution-based inorganic dielectric in the form of a precursor solution or suspended nanoparticles. Subsequent to deposition, the dielectric is appropriately annealed in order to optimize the dielectric layer.

Referring back to FIG. 1, a sixth step of the first OFET implementation is shown, depositing a second conductive layer to form the gate and "contact" conductors. The gate conductor 8 and the contact conductor 9 are formed in two portions of the patterned second conductive layer. The patterned second conductive layer can be formed by inkjet printing of nano-particle silver. Alternatively, the material could be any conductor such as a conductive polymer, flake-based silver inks, or gold, zinc, or aluminum nanoparticles. Methods of deposition could also be flexography, screen printing, gravure, off-set printing, or any other printing methods. The patterned second conductive layer could also be formed by a vapor-deposited metal which is subsequently patterned using standard photolithography techniques. In most cases, the second conductive layer covers both the top surface and the lower surface in the field oxide cavity formed by the active area cavity and the contact cavity. (This configuration is shown in FIG. 1.) However, it is also possible to precede the deposition of the second conductive layer with a step that fills the cavity with a separate conductor (called a plug). This would planarize the second conductive layer, which could be beneficial in some processes.

Referring generally to FIGS. 1-6, the entire fabrication flow has been shown and described and the foregoing description completes the structure of the first OFET implementation according to an embodiment of the present invention. The final OFET structure is shown in FIG. 1.

Referring now to FIGS. 7-12, sequential cross-sectional diagrams are shown corresponding to the process steps for fabricating a top-gate OFET wherein the field dielectric layer is formed after the semiconductor layer is formed according to a second implementation of the present invention. It is important to note that all of the details concerning materials, patterning methods, surface treatments and general advantages of the structure are not repeated with respect to the second implementation as they have already been described in detail above with respect to the first OFET implementation.

Figure 7:
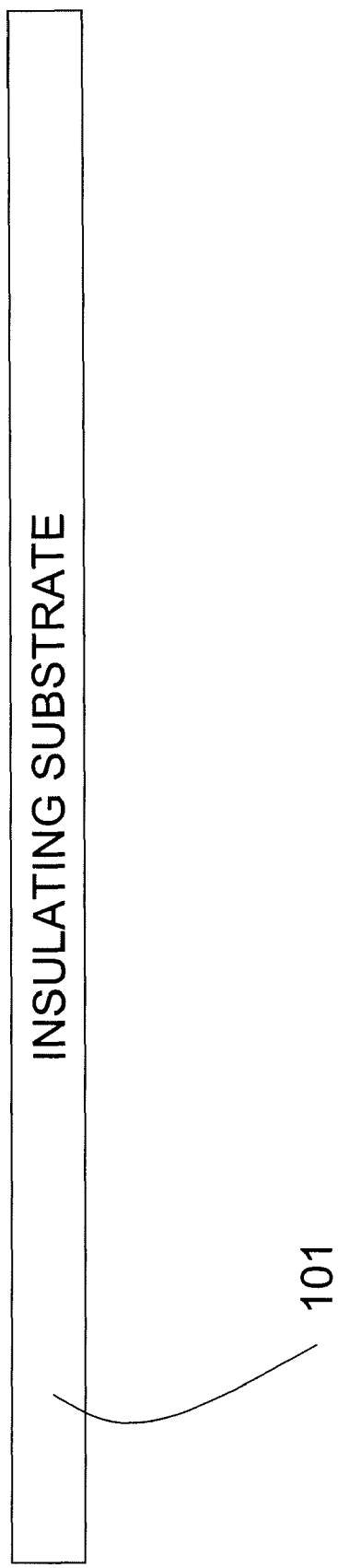
FIGS. 7-12 are sequential cross-sectional diagrams showing the process steps for fabricating a top-gate OFET wherein the field dielectric layer is formed after the semiconductor layer is formed according to the present invention.

Referring now to FIG. 7 the starting substrate of the second OFET implementation is shown. The OFET according to a second implementation of the present invention is fabricated on an insulating substrate 101, which can be rigid or flexible, organic or inorganic. A preferred embodiment of insulating substrate 101 uses PET.

Figure 8:
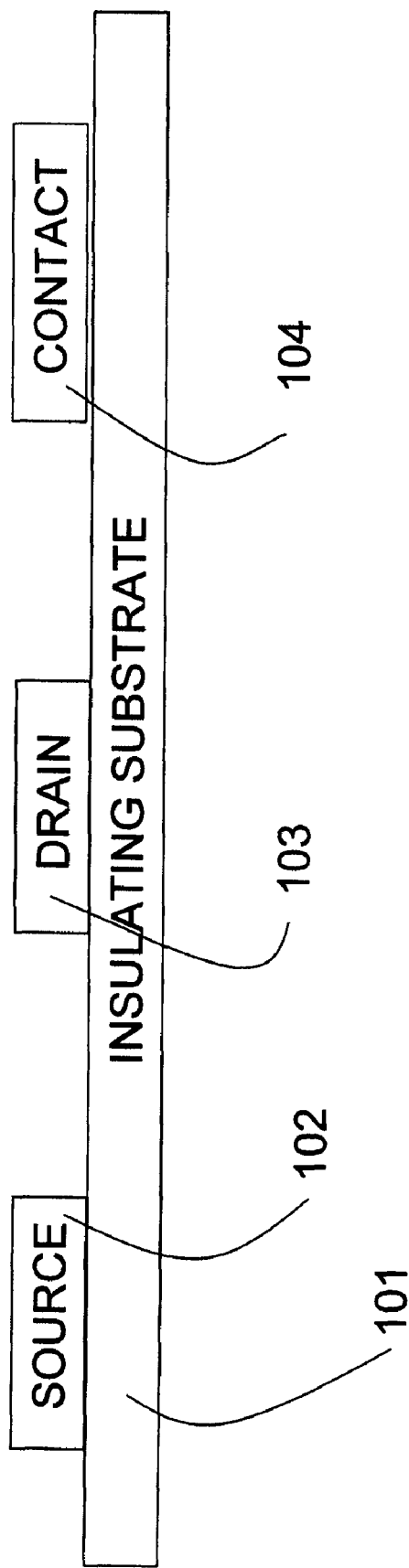

Referring now to FIG. 8, depositing the source/drain and contact conductors is shown for the second OFET implementation. A first conductive layer establishes the source 102 and drain 103 of individual OFET transistors. In addition, the first conductive layer is also used as a means to make connections between sources and drains of other OFET transistors. There will be occasions where a connection is desired to the second conductive layer (the gate conductor of other OFET transistors), a layer to be deposited later. A location where such connection is made with a future layer is referred to as a "contact" 104.

Figure 9:
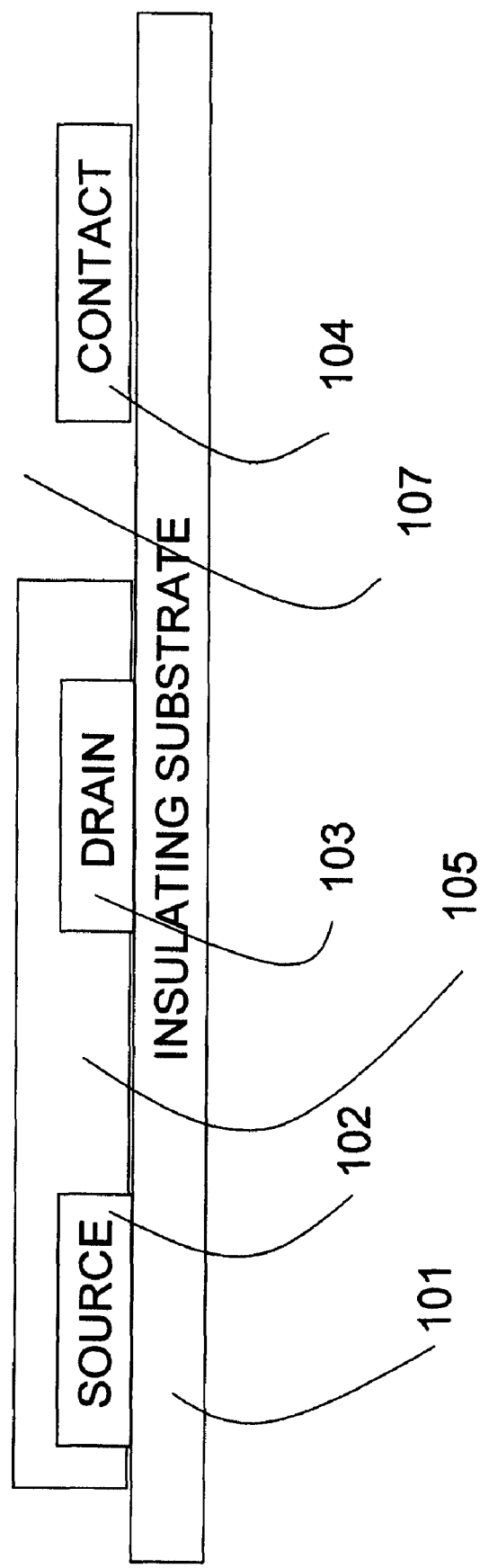

Referring now to FIG. 9, depositing the semiconductor layer is shown for the second OFET implementation. Semiconductor 105 is deposited and patterned to entirely cover the region between source 102 and drain 103 (the channel) and at least partially overlaps the source/drain. This is clearly shown in FIG. 12.

Figure 10:
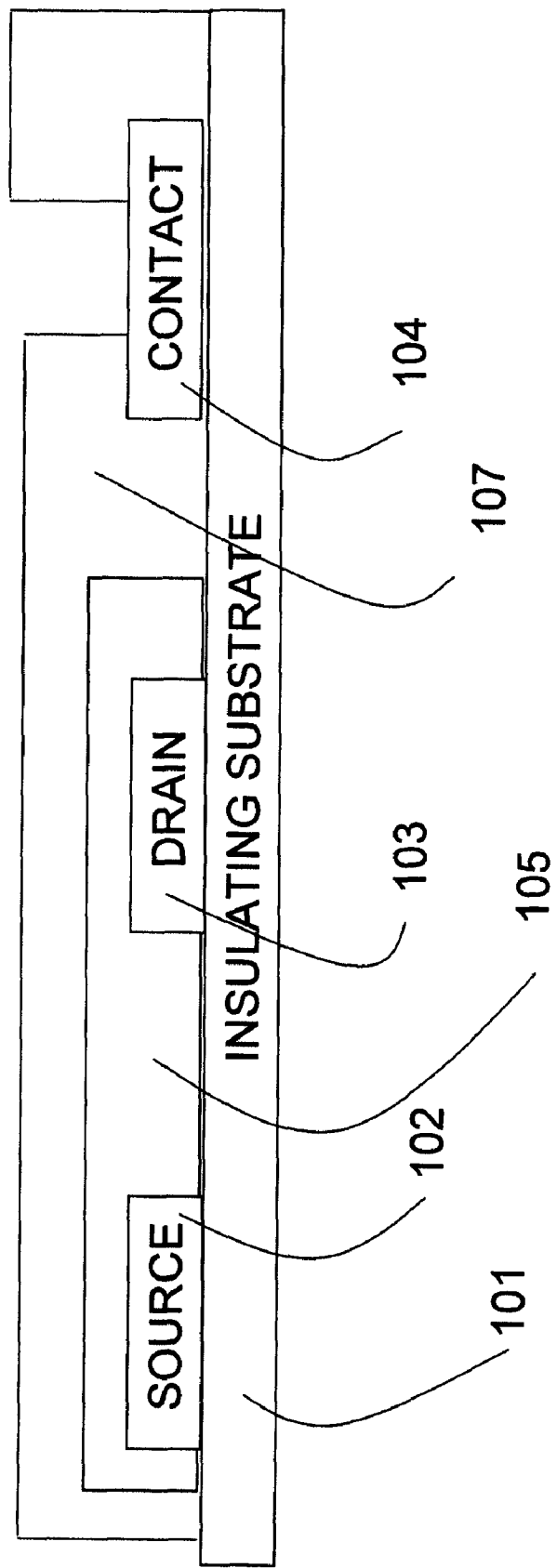

Referring now to FIG. 10, depositing the gate dielectric layer is shown for the second OFET implementation. Gate dielectric 107 is deposited such that at minimum: (1) the channel region of the transistor is covered and (2) a portion of the contact 104 is not covered. Dielectric material over other regions is optional.

Figure 11:
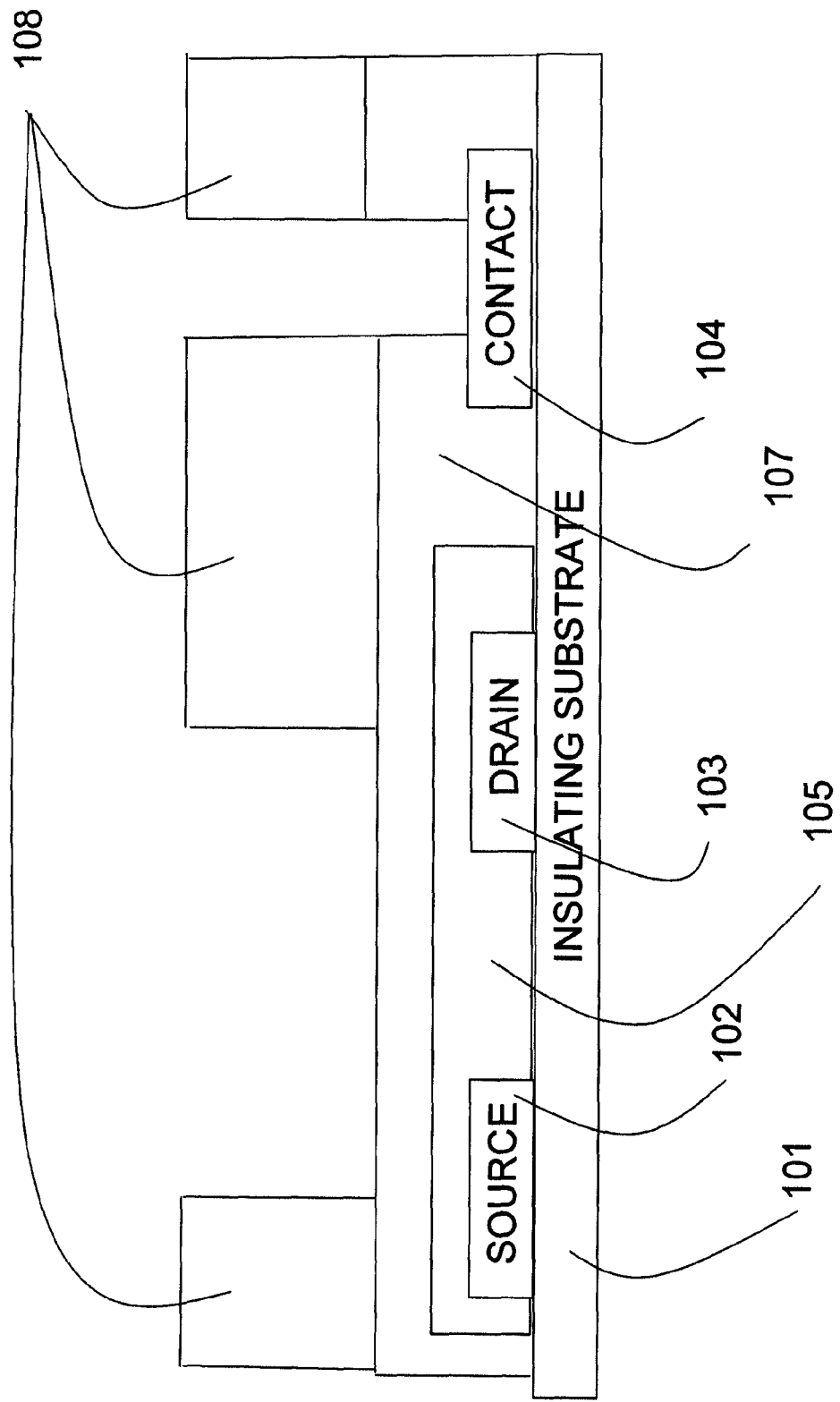

Referring now to FIG. 11, depositing the field dielectric layer is shown for the second OFET implementation. Field dielectric layer 108 is deposited such that at minimum: (1) the channel region of the transistor is not covered and (2) an area over the contact 104 is not covered, and (3) other source/drain conductor areas are covered, as shown in FIG. 11. Preferably, the field oxide layer is deposited as close to the channel edge of the source/drain as possible, while guaranteeing that the field oxide is not in the channel region. Good alignment of the field dielectric serves to reduce the gate capacitance, an important parameter defining the transistor's AC performance characteristics.

Figure 12:
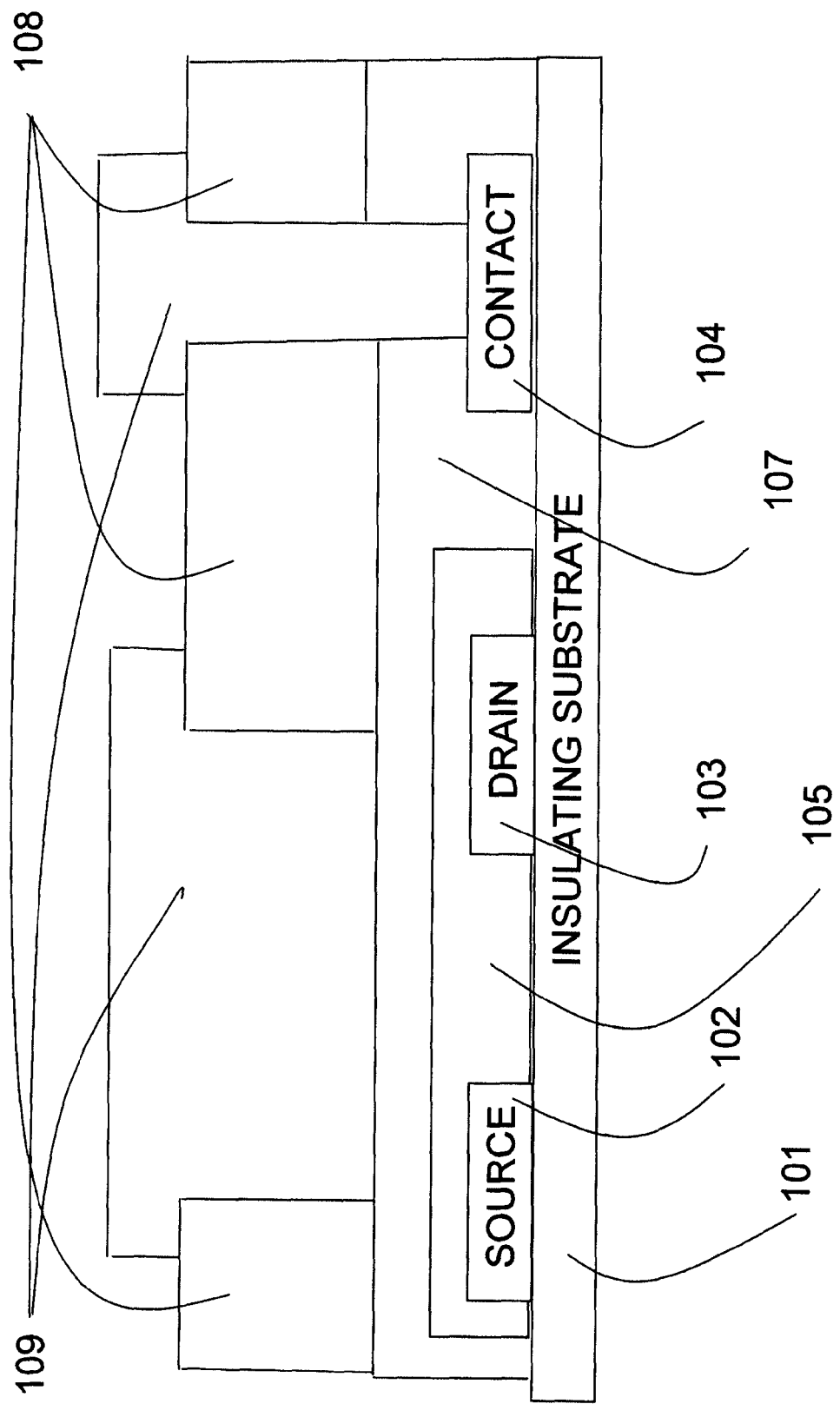

Referring now to FIG. 12, depositing the second conductive layer for the second OFET implementation is shown. Gate and contact conductors 109 are deposited from the patterned second conductive layer. Though FIG. 12 indicates a planar surface between the field and the channel regions, this is not necessary. The field oxide in this structure serves to reduce the capacitance between the gate and source electrodes, as well as the capacitance between the gate dielectric 107 and the semiconductor layer 105 in non-channel regions.

The completed second implementation on an OFET according to the present invention is shown in FIG. 12.

Figure 13:
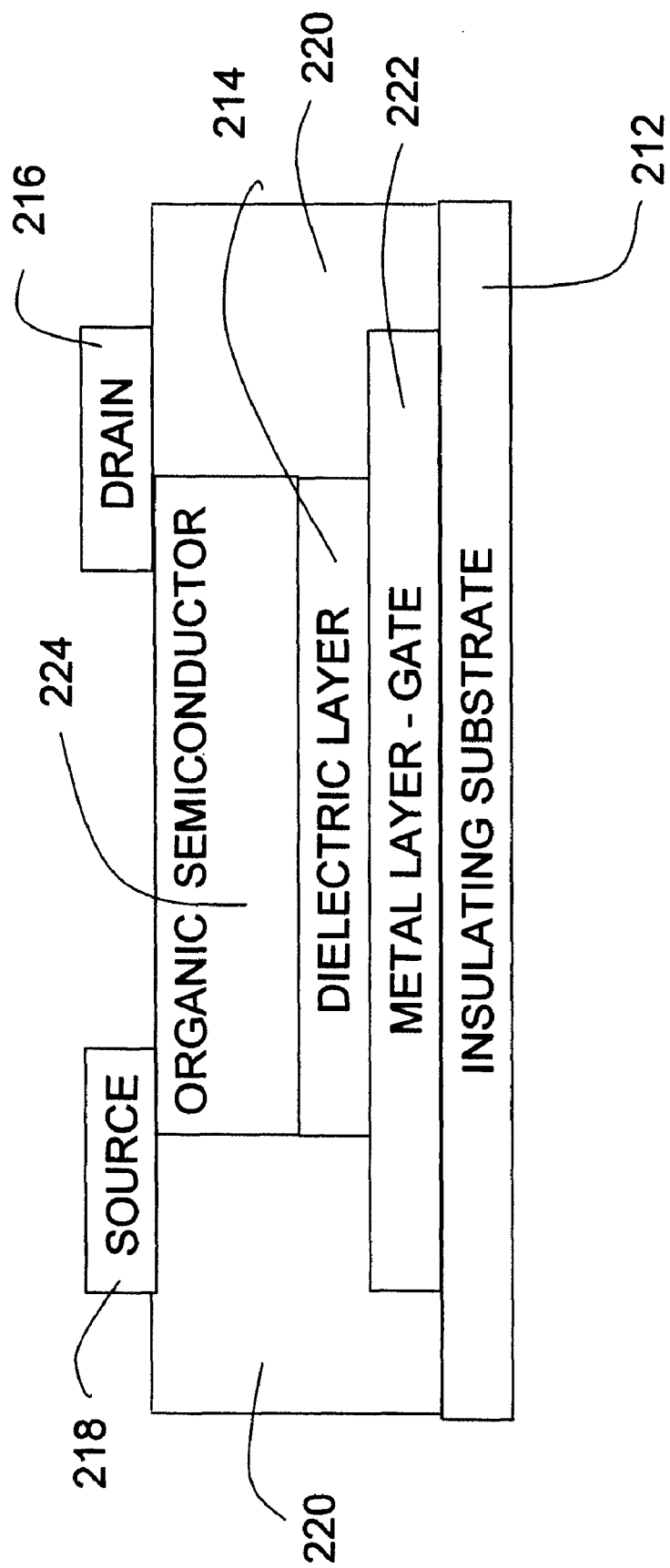
FIG. 13 is a cross-sectional diagram of a bottom-gate OFET structure according to the present invention.

Referring now to FIG. 13, a bottom-gate, field oxide OFET structure is shown according to the present invention. Field oxide can also be introduced into the bottom-gate structure. This structure can be formed as follows:

(1) Deposit and pattern the gate conductor 222 on insulating substrate 212, leaving an open channel region of transistor (referred to as the active area cavity);

(2) Deposit field oxide 220 inside the active area cavity as shown. The flow of dielectric ink is confined within the cavity;

(3) Deposit semiconductor 224 inside the active area cavity as shown. The flow of dielectric ink is also confined within the cavity;

(4) Deposit source/drain conductors 218/216 such that the source/drain overlaps the semiconductor layer 224. Though FIG. 13 shows the source/drain on the field oxide 220 on the same level as over the channel, this is not necessary.

Referring now to FIGS. 14-19, sequential cross-sectional diagrams are show corresponding to the process steps for fabricating a ferroelectric capacitor and a vertical resistor. The ferroelectric capacitor and vertical resistor shown in FIGS. 14-19 are suitable for being integrated with other organic and OFET structures according to the present invention. The combined structures are shown for convenience only. The drawing FIGS. 14-19 are not meant to imply that a vertical resistor must accompany a ferroelectric capacitor or vice/versa. These structures may be integrated separately with other such devices or other OFETS in any configuration that is desired for a specific circuit application.

Figure 14:
FIGS. 14-19 are sequential cross-sectional diagrams showing the process steps for fabricating a ferroelectric capacitor and a vertical resistor suitable for being integrated with other organic and OFET structures according to the present invention.

Referring now to FIG. 14, the insulating substrate 1702 is shown for the ferroelectric capacitor and the vertical resistor.

Figure 15:
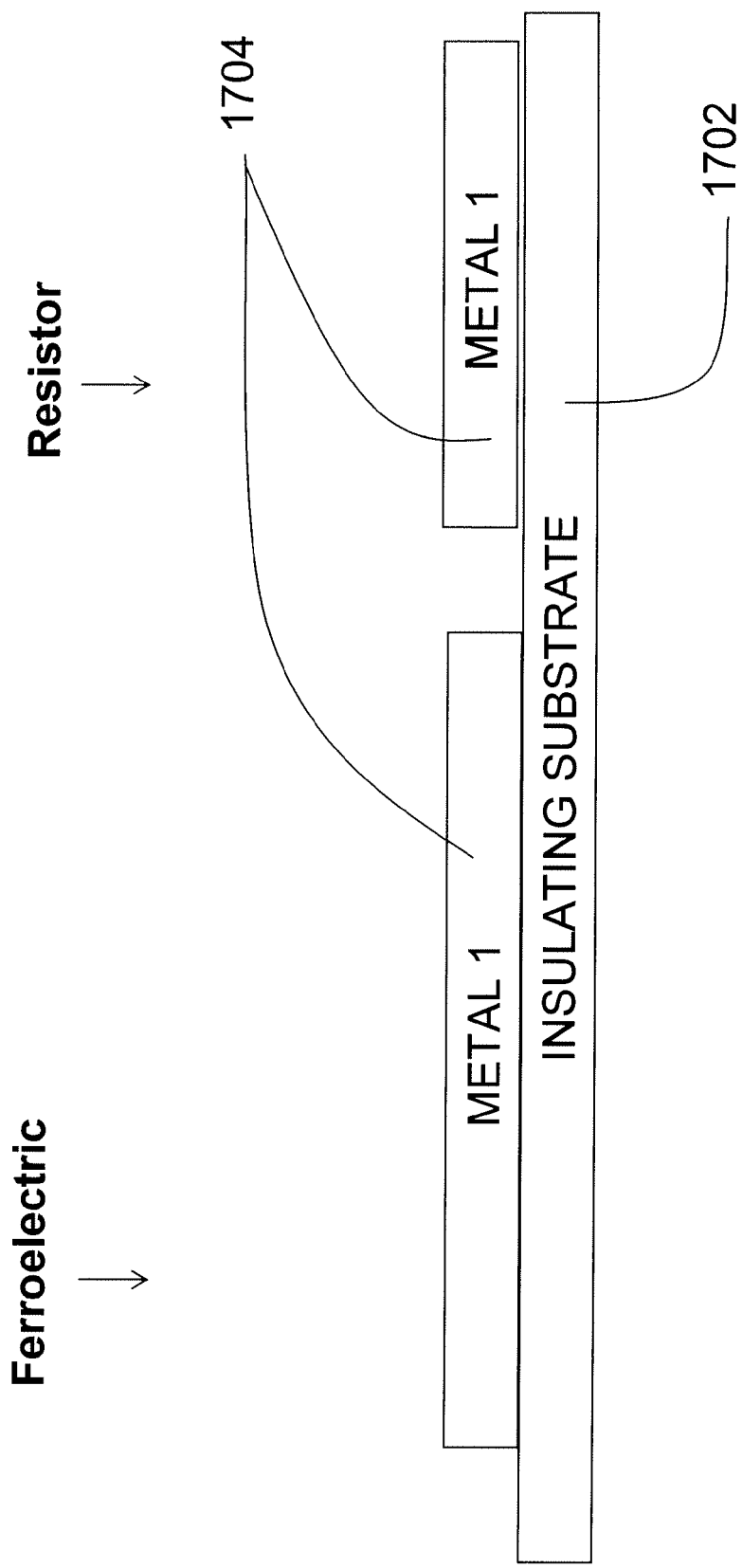

Referring now to FIG. 15, the first metal layer deposition is shown. The first metal layer 1704 is deposited at the same time as the source/drain metal is deposited for the OFET as described above. In the ferroelectric capacitor region, the first metal layer becomes the bottom electrode of the capacitor. In the resistor region, the first metal layer becomes a bottom contact to the resistor.

Figure 16:
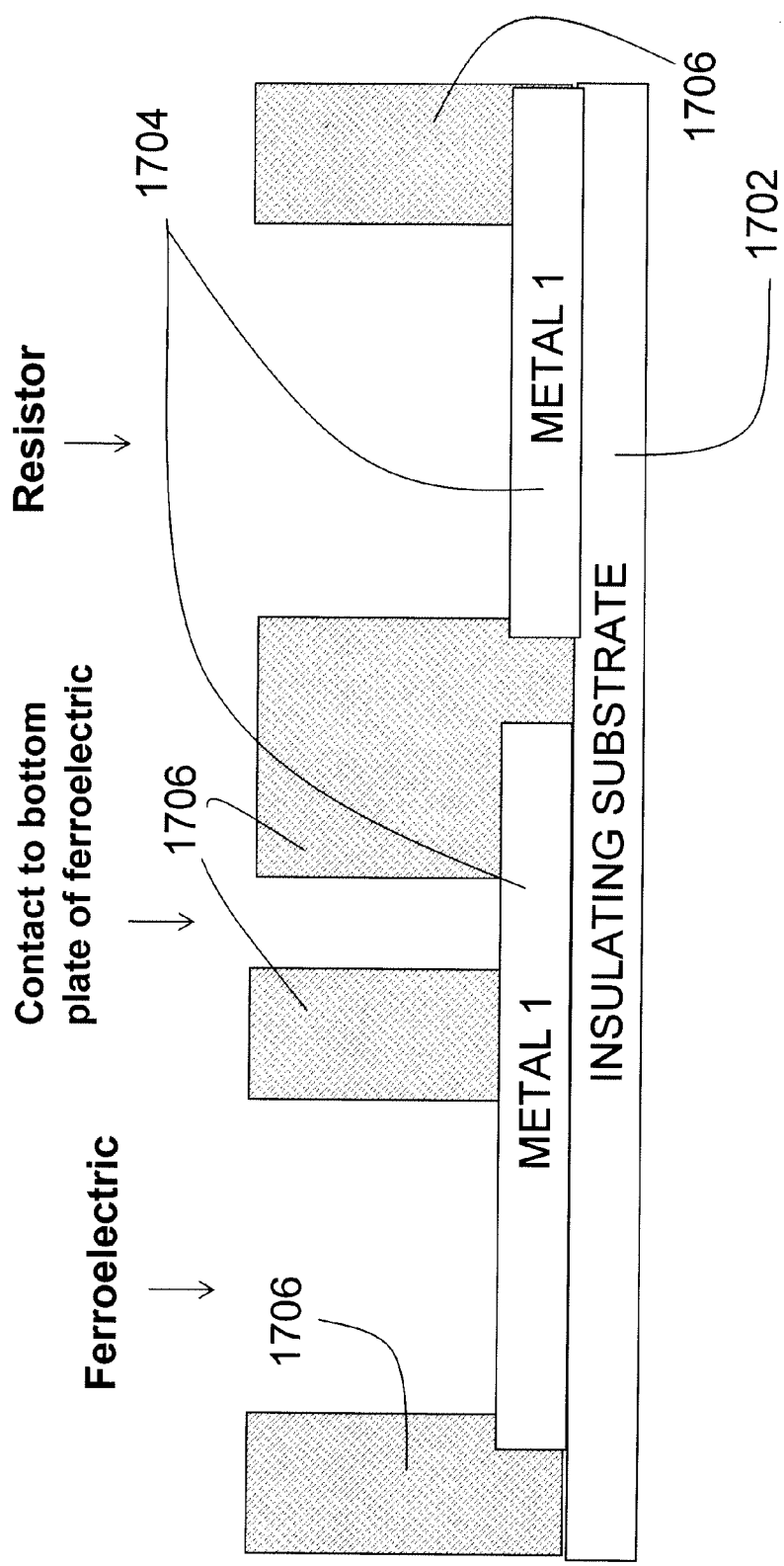

Referring now to FIG. 16, the field dielectric layer deposition and definition is shown. A patterned field dielectric layer 1706 is shown having openings for the ferroelectric capacitor structure, the contact to the bottom plate of the ferroelectric capacitor, and for the vertical resistor structure. A similar contact to the bottom connection of the resistor could be made, but is not shown in FIG. 19.

Figure 17:
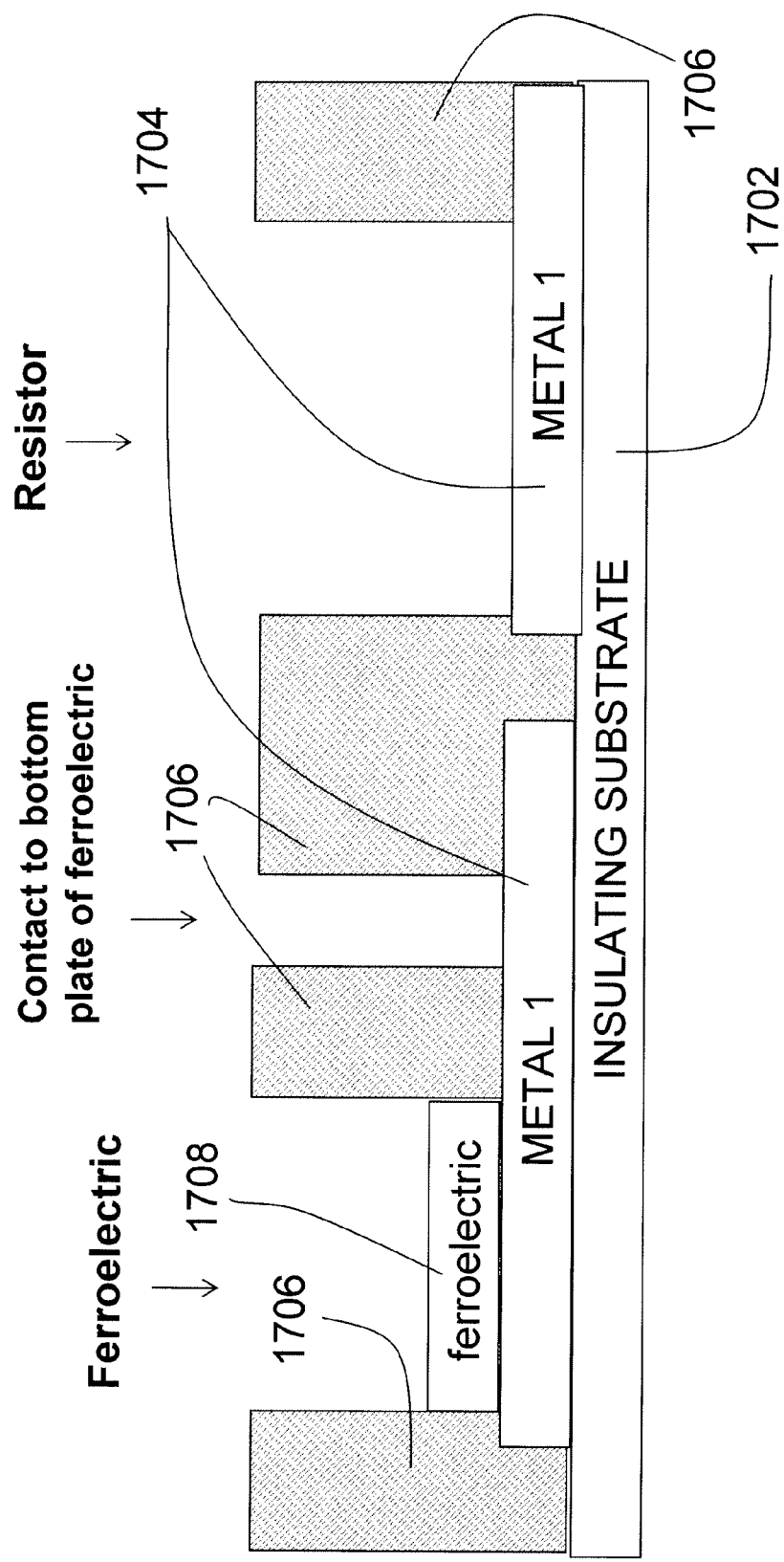

Referring now to FIG. 17, the deposition of the ferroelectric layer 1708 is shown. A ferroelectric polymer solution is dropped into the cavity in the field dielectric layer 1706 reserved for the ferroelectric capacitor structure.

Figure 18:
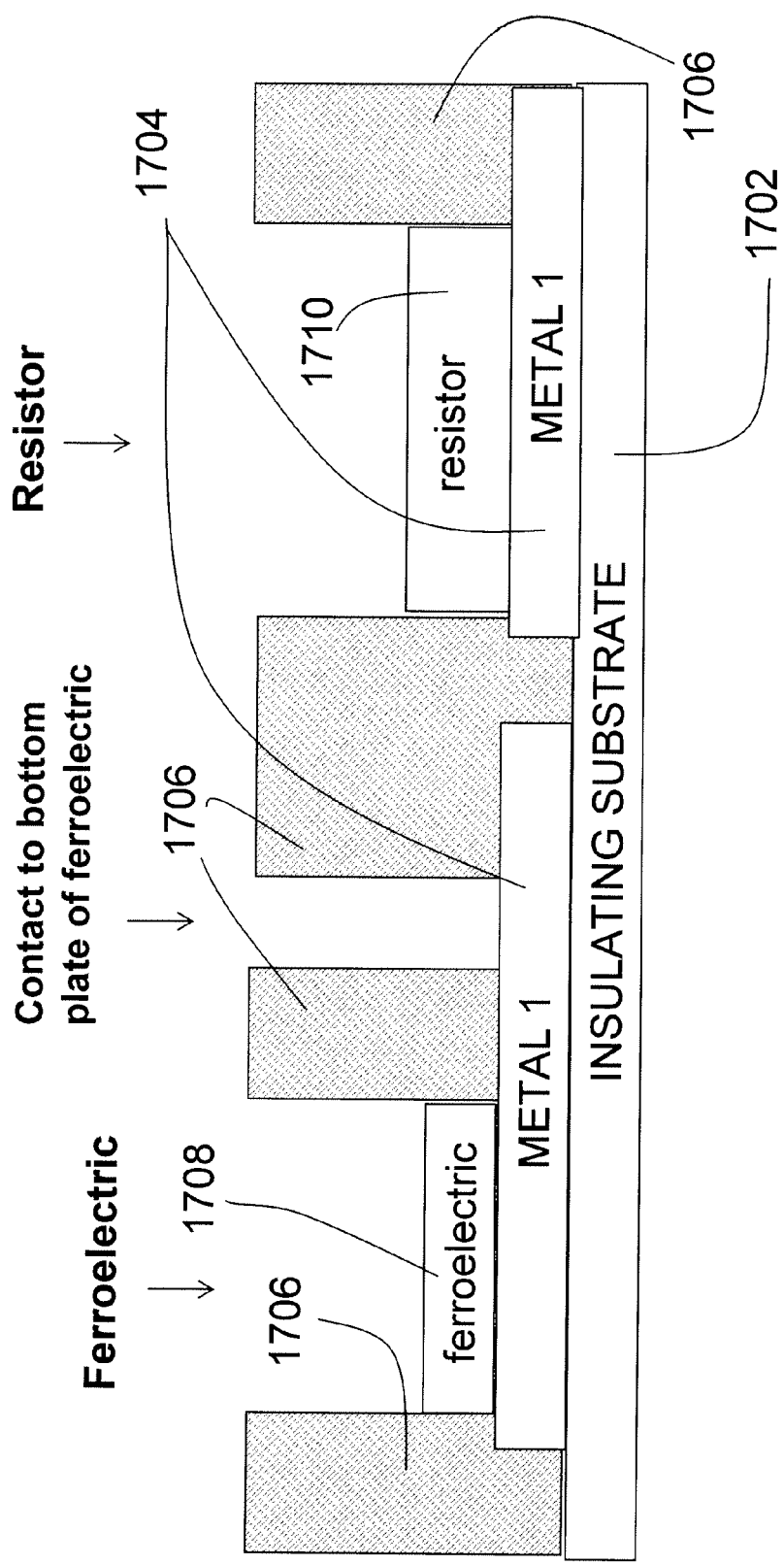

Referring now to FIG. 18, the deposition of the resistive layer 1710 for the vertical resistor is shown. A resistive material is dropped into the cavity in the field dielectric layer 1706 reserved for the vertical resistor structure. The resistive material can be PEDOT, carbon black, or even an organic semiconductor material. Depending upon the characteristics of the organic semiconductor, the vertical resistor structure could also exhibit diode characteristics if this is desired.

Figure 19:
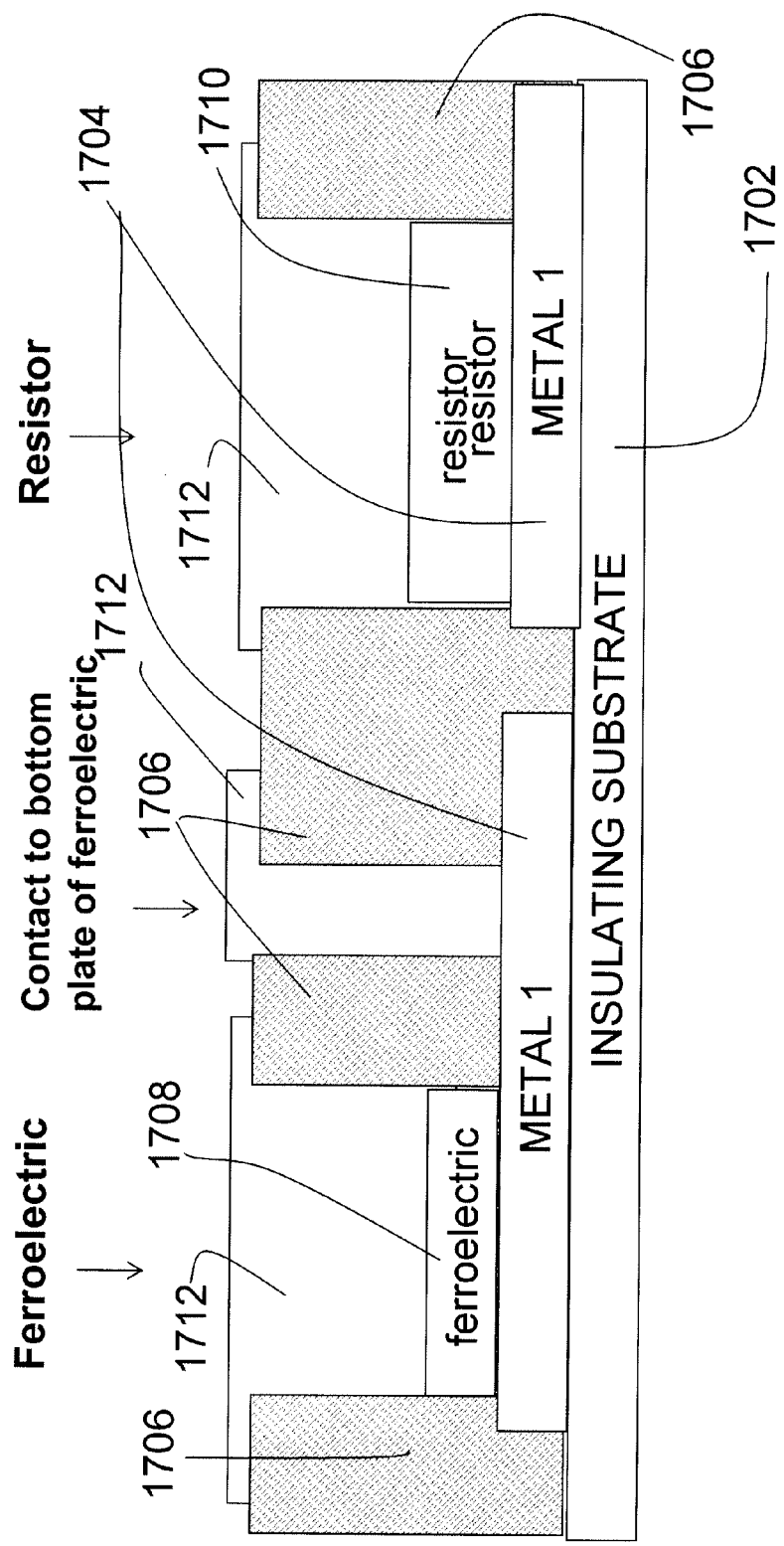

The finished ferroelectric capacitor and vertical resistor structures are shown in FIG. 19, wherein a patterned second metal layer 1712 forms the top electrode of the ferroelectric capacitor, contacts the first metal layer 1704 to provide access to the bottom electrode of the ferroelectric capacitor, and forms the top contact for the vertical resistor. In FIG. 19, the ferroelectric capacitor plates can be both contacted by the second metal layer contacts, and a vertical resistor is formed between the first and second metal layers.

Referring now to FIGS. 20-24, sequential cross-sectional diagrams are show corresponding to the process steps for fabricating a lateral resistor suitable for being integrated with other organic and OFET structures according to the present invention.

Figure 20:
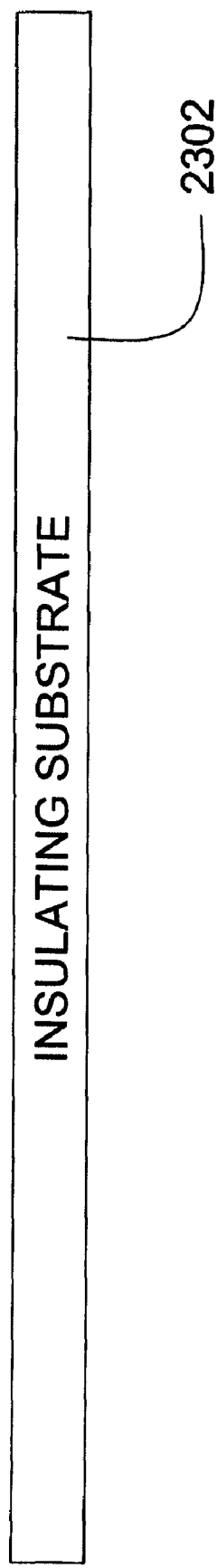
FIG. 20-24 are sequential cross-sectional diagrams showing the process steps for fabricating a lateral resistor suitable for being integrated with other organic and OFET structures according to the present invention.

Referring now to FIG. 20, the insulating substrate 2302 for the lateral resistor is shown.

Figure 21:
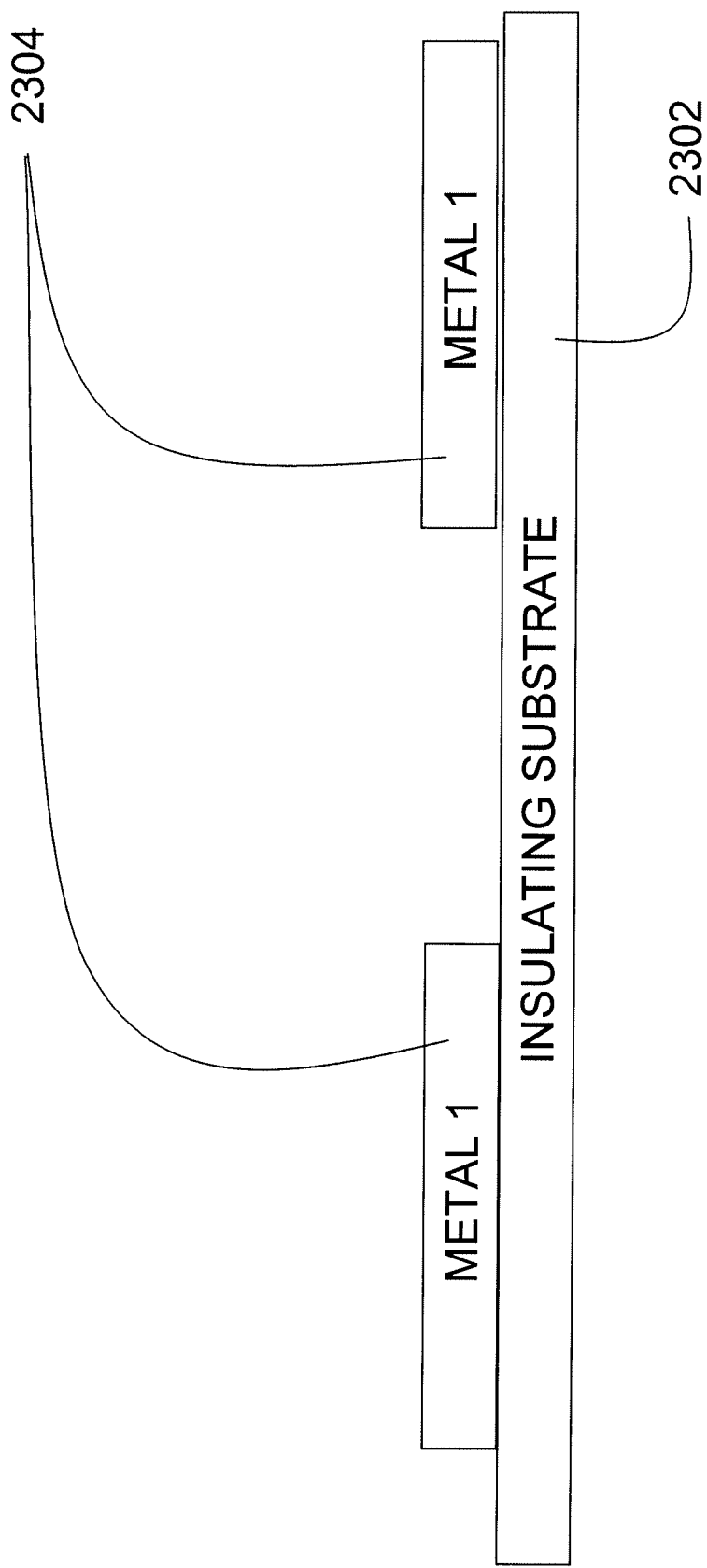

Referring now to FIG. 21, the patterned first metal layer 2304 is shown that will form the two lateral resistor contacts.

Figure 22:
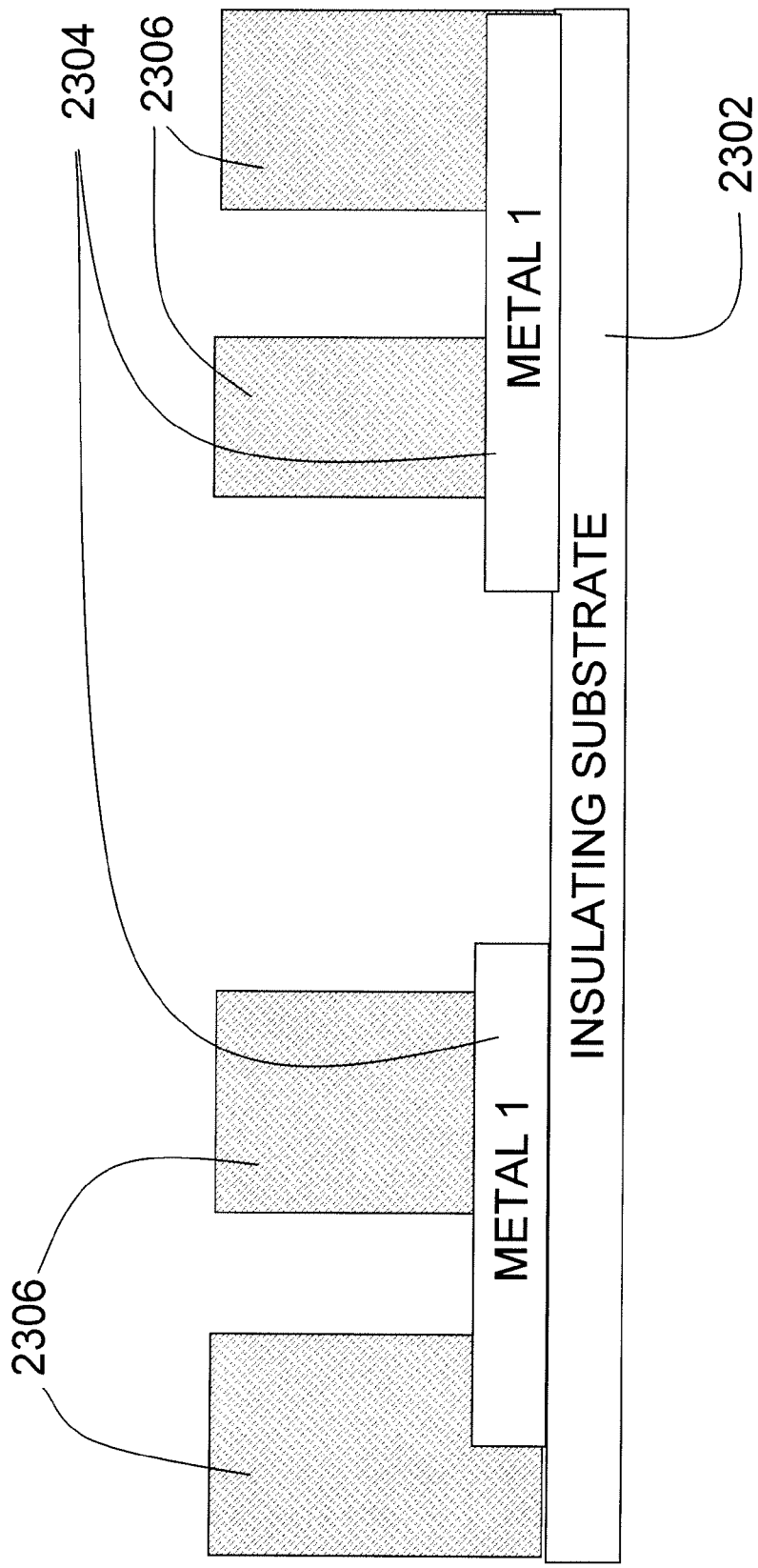

Referring now to FIG. 22, a patterned field dielectric layer 2306 is shown. Openings at either end of the structure are cavities for forming the first and second lateral resistor contacts, and the cavity in the middle of the structure is reserved for resistor structure itself.

Figure 23:
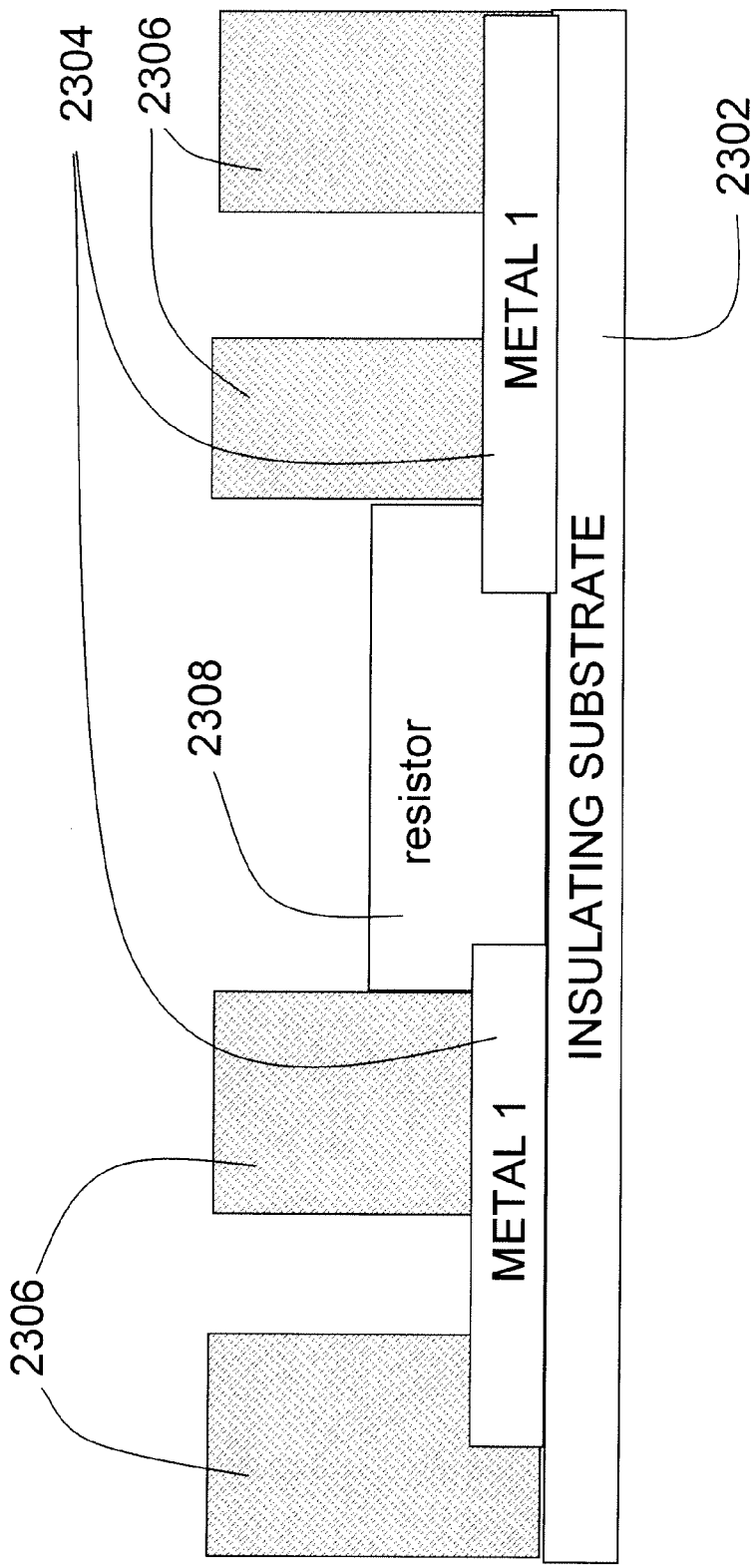

Referring now to FIG. 23, the deposition of resistor layer 2308 is shown. The resistive material is dropped into the center cavity as described above. The resistive material is PEDOT, carbon black, organic or inorganic semiconductor material, or any solution-based material whose dry properties exhibit electrical resistance. If a semiconductor material is used, diode characteristics can be exhibited.

Figure 24:
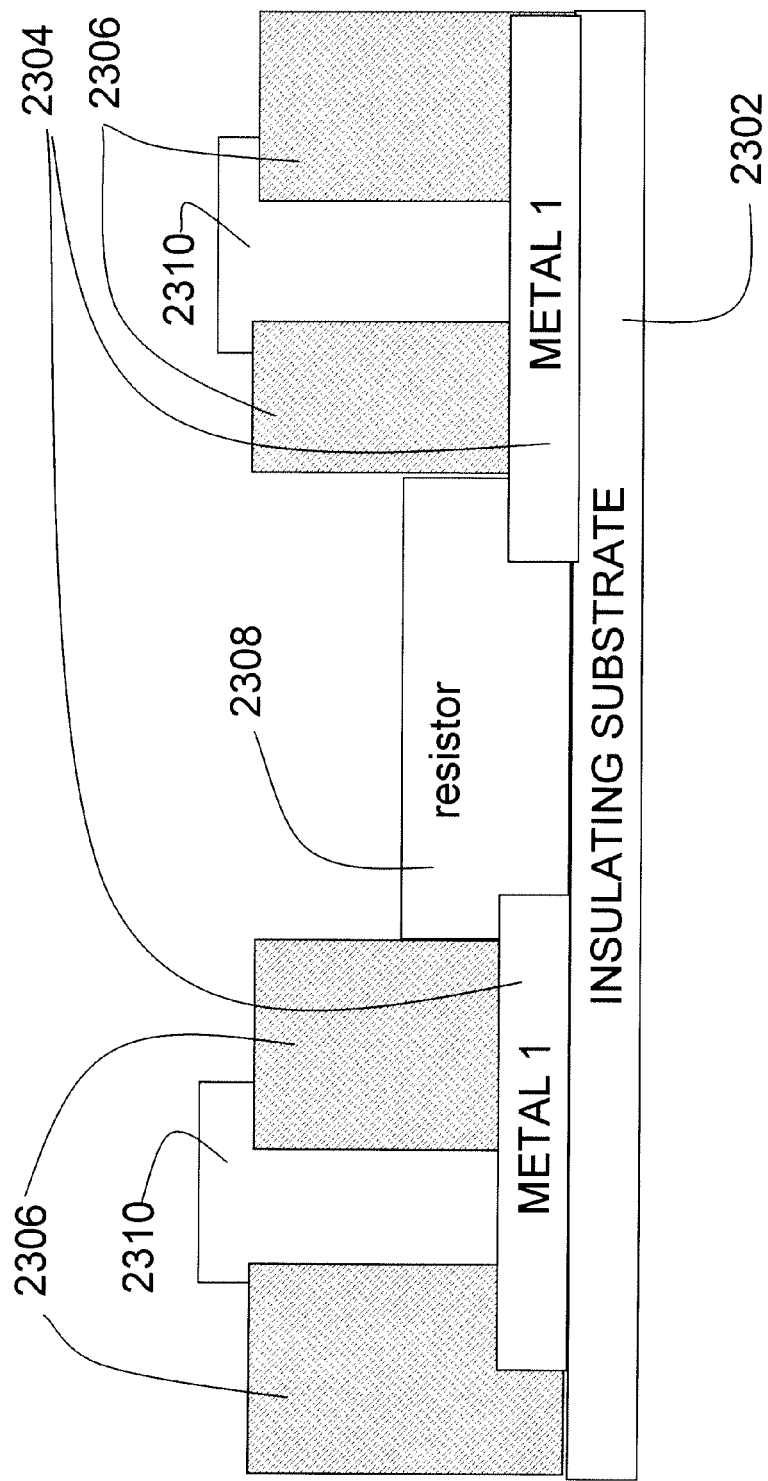

Referring now to FIG. 24, the patterned second metal layer 2310 is shown. Second level metal contact is made on either end of the lateral resistor shown in FIG. 27. The resistance of the lateral resistor shown in FIG. 27 is defined by the lateral resistance of the material between the two first level metal contacts 2304. Making contact to the second metal layer is optional. The lateral resistance, if desired, can simply between the two patterned first metal contacts 2304. A combination of first and second metal layer contacts can also be used.

Having described and illustrated the principle of the invention in a preferred embodiment thereof, it is appreciated by those having skill in the art that the invention can be modified in arrangement and detail without departing from such principles. Although a preferred method and circuit has been shown, the exact details of the preferred method and circuit can be changed as desired as required for a particular application. We therefore claim all modifications and variations coming within the spirit and scope of the following claims.

We claim:

1. A method of forming an OFET comprising: providing an insulating substrate; providing a patterned first conductive layer to establish source, drain, and contact region; providing a patterned field dielectric layer to form an opening above a transistor active area between the source and the drain region, and above the contact region; depositing a solution-based semiconductor in the transistor active area cavity defined by the field dielectric layer; depositing a solution-based gate dielectric layer in the transistor active area cavity defined by the field dielectric layer; and depositing a second conductive layer in the transistor active area and contact cavities defined by the field dielectric layer.

2. The method of claim 1 wherein providing the patterned first conductive layer and/or the patterned field dielectric layer is achieved in a single step.

3. The method of claim 1 wherein providing the patterned first conductive layer and/or the patterned field dielectric layer is achieved in a deposition step followed by a patterning step.

4. The method of claim 1 wherein the insulating substrate comprises PET, PEN, or Kapton.

5. The method of claim 1 wherein the field dielectric layer comprises a low dielectric constant material including organic materials such as polyvinyl phenol PVP and derivatives PNP-CPC and PVP-CL, poly (3,4-ethylenedioythiophene), PVA, CYPEL, ferroelectric polymers, or silicon nitride or inorganic materials in the form of a precursor solution or suspended nanoparticles such as silicon dioxide, titanium dioxide, or aluminum oxide.

6. The method of claim 1 wherein depositing the solution-based semiconductor comprises inkjet printing, pico-dropping or spinning.

7. The method of claim 1 wherein the solution-based semiconductor comprises an organic semiconductor such as polythiophene or solution-based pentacene, or a solution based inorganic semiconductor in the form of a precursor solution or suspended nanoparticles such as silicon or gallium arsenide.

8. The method of claim 1 further comprising treating deposition surfaces prior to depositing the solution-based semiconductor to create improved order in the final semiconductor layer.

9. The method of claim 1 further comprising annealing the solution-based semiconductor subsequent to deposition to optimize order in the semiconductor layer.

10. The method of claim 1 wherein depositing the solution-based dielectric comprises inkjet printing, pico-dropping or spinning.

11. The method of claim 1 wherein the solution-based dielectric material comprises organic materials such as polyvinyl phenol PVP and derivatives PVP-CP and PVP-CL,
poly (3,4-ethylenedioythiophene), PVA, CYPEL, ferroelectric polymers, silicon nitride or
inorganic materials in the form of a precursor solution such as or suspended nanoparticles
such as silicon dioxide, titanium dioxide, and aluminum dioxide.

12. The method of claim 1 further comprising planarizing the second conductive layer.

* * * * *